United States Patent
Park et al.

(10) Patent No.: US 9,735,214 B2
(45) Date of Patent: Aug. 15, 2017

(54) ORGANIC LIGHT EMITTING DISPLAY DEVICE AND MANUFACTURING METHOD THEREOF

(71) Applicant: LG Display Co., Ltd., Seoul (KR)

(72) Inventors: Hong-Ki Park, Goyang-si (KR); Hyo-Dae Bae, Paju-si (KR); Soo-Jin Kim, Goseong-gun (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 14/939,898

(22) Filed: Nov. 12, 2015

(65) Prior Publication Data

US 2016/0190217 A1   Jun. 30, 2016

(30) Foreign Application Priority Data

Dec. 31, 2014   (KR) .................. 10-2014-0195136

(51) Int. Cl.
   *H01L 27/32*   (2006.01)
   *H01L 51/00*   (2006.01)

(52) U.S. Cl.
   CPC ...... *H01L 27/3246* (2013.01); *H01L 51/0005* (2013.01)

(58) Field of Classification Search
   CPC .................. H01L 27/3246; H01L 51/0005
   USPC .......................................... 257/40
   See application file for complete search history.

(56) References Cited

U.S. PATENT DOCUMENTS

| | | | |
|---|---|---|---|
| 2005/0057151 A1* | 3/2005 | Kuwabara | H05B 33/22 313/506 |
| 2010/0181554 A1 | 7/2010 | Yoshida et al. | |
| 2010/0327297 A1 | 12/2010 | Yoshida et al. | |
| 2011/0198596 A1 | 8/2011 | Park | |
| 2013/0001603 A1* | 1/2013 | Lim | H01L 51/5209 257/88 |
| 2013/0082288 A1* | 4/2013 | Kim | H01L 27/322 257/89 |
| 2014/0353630 A1 | 12/2014 | Baek et al. | |
| 2015/0001474 A1* | 1/2015 | Park | H01L 51/5271 257/40 |

FOREIGN PATENT DOCUMENTS

| | | |
|---|---|---|
| JP | 2008-243406 A | 10/2008 |
| JP | 2010-50107 A | 3/2010 |

(Continued)

*Primary Examiner* — Fernando L Toledo
*Assistant Examiner* — Adam S Bowen
(74) *Attorney, Agent, or Firm* — Birch, Stewart, Kolasch & Birch, LLP (57) ABSTRACT

An organic light emitting display (OLED) device, and a method for manufacturing the OLED device are discussed. The OLED device according to one embodiment includes a thin film transistor formed on a substrate; a planarization layer formed on the thin film transistor; a first bank layer including a first opening; a lower electrode formed in the first opening and connected to the thin film transistor, an end segment of the lower electrode being disposed on the first bank layer; a second bank layer formed on the first bank layer and covering the end segment of the lower electrode, the second bank layer including a second opening corresponding to the first opening; an organic emitting layer formed on the lower electrode and in the second opening; and an upper electrode formed on the organic emitting layer.

20 Claims, 7 Drawing Sheets

(56) References Cited

FOREIGN PATENT DOCUMENTS

| | | |
|---|---|---|
| JP | 2011-9017 A | 1/2011 |
| KR | 10-2009-0036483 A | 4/2009 |
| KR | 10-2011-0094460 A | 8/2011 |
| KR | 10-2014-0141372 A | 12/2014 |

* cited by examiner

ORGANIC LIGHT EMITTING DISPLAY DEVICE AND MANUFACTURING METHOD THEREOF

CROSS REFERENCE TO RELATED APPLICATIONS

The present application claims the benefit of Korean Patent Application No. 10-2014-0195136 filed in Korea on Dec. 31, 2014, the contents of which are hereby incorporated by reference in their entirety.

BACKGROUND OF THE INVENTION

Field of the Disclosure

The present invention relates to an organic light emitting display (OLED) device capable of preventing a pile-up problem and a manufacturing method thereof.

Description of the Related Art

Flat display devices having a thin profile, light weight, low power consumption and high display quality include a liquid crystal display (LCD) device, a plasma display panel (PDP) and an OLED device. The OLED device is self-emitting and does not require an additional light source. As a result, the OLED device can be thinner and lighter weight and have a faster response time, improved color reproduction, lower power consumption, improved viewing angle, etc. Generally, the OLED device is manufactured by a dry process such as a vapor deposition. However, a wet process such as inkjet printing can be used to fabricate an OLED device having an increased size.

Figure 1A:
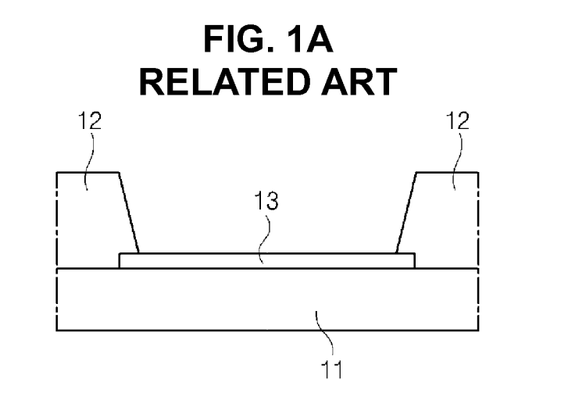
- FIGS. 1A and 1B are schematic cross-section views showing a manufacturing process of the OLED device according to related art.
Figure 1B:
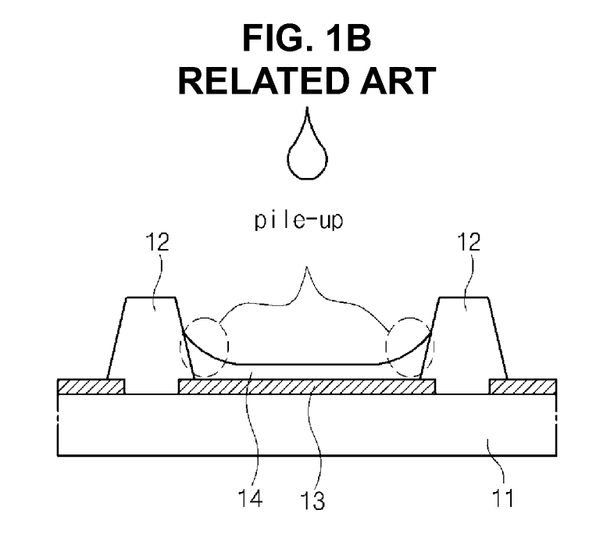

FIGS. 1A and 1B are schematic cross-section views illustrating a manufacturing process of the OLED device according to related art.

Referring to FIG. 1A, a lower electrode 13 is formed on a planarization layer 11, which can be formed to cover a thin film transistor for driving an OLED device, and a bank layer 12 is formed on peripheries of the lower electrode 13. A center of the lower electrode 13 is exposed through an opening of the bank layer 12.

Referring to FIG. 1B, an organic emitting layer 14 is formed on the lower electrode 13. The organic emitting layer 14 contacts the lower electrode 13 though the opening of the bank layer 12. When the organic emitting layer 14 is formed by a wet process, a pile-up problem is generated in the organic emitting layer 14. Namely, a center of the organic emitting layer 14 has a thickness that is different than a thickness of the peripheries of the organic emitting layer 14. In particular, a solvent in a solution for the organic emitting layer 14 is evaporated at peripheries of the lower electrode 13 before a solvent in a solution for the organic emitting layer 14 at the center of the lower electrode 13 due to a Coffee-Ring effect, which causes the organic emitting material to move toward the peripheries of the lower electrode 13 via surface tension. As result, peripheries of the organic emitting layer 14 are thicker than a center of the organic emitting layer 14.

Figure 2A:
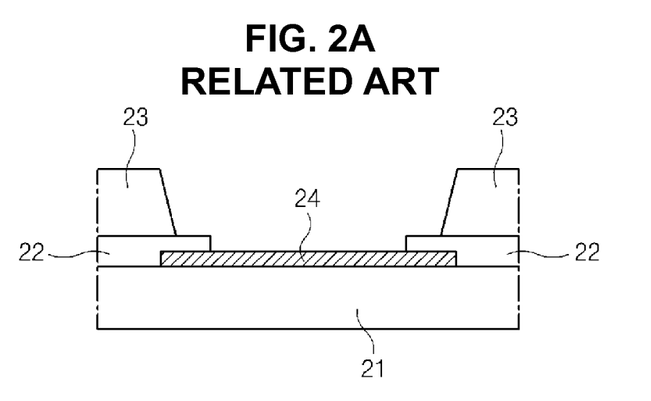
FIGS. 2A and 2B are a cross-sectional view and flow chart illustrating another OLED device according to related art.
Figure 2B:
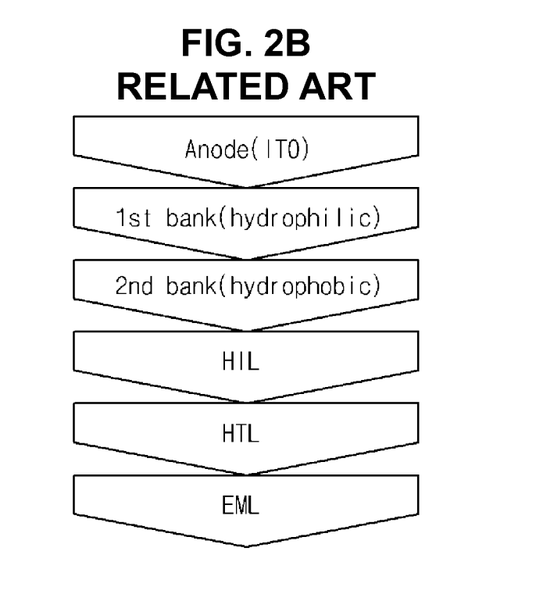

Next, FIGS. 2A and 2B are a cross-sectional view and flow chart illustrating another OLED device according to related art.

Referring to FIGS. 2A and 2B, the OLED device includes a double-layered bank layer. Namely, a bank layer including a lower bank layer 22 and an upper bank layer 23 is formed on the peripheries of the lower electrode 24 on the planarization layer 21. The lower electrode 24 as an anode, for example, may be formed of indium-tin-oxide (ITO), and an organic emitting layer, which includes a hole injection layer (HIL), a hole transporting layer (HTL), an emitting material layer (EML) etc., may be formed on the lower electrode 24. The OLED device including the lower electrode 24 as an anode formed of ITO, and the organic emitting layer formed on the lower electrode 24, may include the lower bank layer 22 formed of a hydrophilic material, and the upper bank layer 23 formed of a hydrophobic material. However, the OLED device including the double-layered bank layer has is limited due to a decreased size of the emitting area resulting from a process margin for overlapping the lower electrode 24, the lower bank layer 22 and the upper bank layer 23.

SUMMARY OF THE INVENTION

To solve these problems, according to an embodiment of the present invention, an OLED device and a manufacturing method thereof that substantially obviate one or more of the problems due to limitations and disadvantages of the related art. An object of the present invention is to provide the OLED device and the manufacturing method thereof capable of preventing the pile-up problem without decreasing a size of an emitting area in the OLED device. Additional features and advantages of the invention will be set forth in the description which follows, and in part will be apparent from the description, or may be learned by practice of an embodiment of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the present invention provides an organic light emitting display device including a thin film transistor on a substrate; a planarization layer on or over the thin film transistor; a first bank layer on the planarization layer and including a first opening; a lower electrode in the first opening and connected to the thin film transistor, an end of the lower electrode being disposed on or over the first bank layer; a second bank layer on the first bank layer and covering the end of the lower electrode, the second bank layer including a second opening corresponding to the first opening; an organic emitting layer on the lower electrode and in the second opening; and an upper electrode on the organic emitting layer.

In another aspect, the present invention provides a manufacturing method of an organic light emitting display device including forming a thin film transistor on a substrate; forming a planarization layer on or over the thin film transistor; forming a first bank layer including a first opening on the planarization layer; forming a lower electrode in the first opening and connected to the thin film transistor, an end of the lower electrode being disposed on or over the first bank layer; forming a second bank layer on the first bank layer and covering the end of the lower electrode, the second bank layer including a second opening corresponding to the first opening; forming an organic emitting layer on the lower electrode and in the second opening; and forming an upper electrode on the organic emitting layer.

It is to be understood that both the foregoing general description and the following detailed description are exemplary and explanatory and intended to provide further explanation of embodiments of the invention.

BRIEF DESCRIPTION OF THE DRAWINGS

The accompanying drawings, which are included to provide a further understanding of embodiments of the inven

DETAILED DESCRIPTION OF THE INVENTION

The present invention will be embodied in many different forms and is not limited to the embodiments set forth herein. Rather, these embodiments are provided to complete the disclosure of the present invention and completely convey the concept of the invention to one of skill in the art. In addition, elements of the embodiments of the present invention as disclosed below can be combined with each other, and the combination of the elements belongs to a scope of the present invention.

Shapes, sizes, rates, angles, numbers, etc. as disclosed in the drawings for explaining the embodiments of the present invention are illustrative and are not limited to the details shown. Wherever possible, the same reference numerals throughout the specification refer to the same or like parts. Additionally, in the following description of embodiments of the present invention, a detailed description of the well-known technique that is determined to unnecessarily obscure the subject matter of the embodiments of the present invention will be omitted.

In cases that "include", "have", "comprise", etc. are mentioned in this specification, other parts may be added unless "only" is used. The term of the component used in the singular can also include plural components. Interpretation of the component includes a margin of error even if there is no clear description. When the description of the positional relationship between two parts includes 'on', 'over', 'under', 'beside', etc., one or more parts may be positioned between the two parts unless "right" or "direct" is used.

When the description of the time sequential relation includes 'after', 'followed by', 'next', 'before', etc., non-continuous cases may be included unless "right" or "direct" is used. When the description of the time sequential relation includes 'after', 'followed by', 'next', 'before', etc., non-continuous cases may be included unless "right" or "direct" is used. The first, second, etc. may be used to describe these various components, but these components are not limited by these terms. These terms are only used to distinguish one component from the other components. Thus, for example, the first component referred to below may be a second component within the scope of embodiments of the present invention.

Characteristics of the various embodiments of the present invention may be partially or fully coupled to or combined with each other and may be technically variously linked and driven, and each of the embodiments may be performed independently with respect to each other and be carried together in relation with each other. Hereinafter, embodiments of the present invention will be described in detail with reference to accompanying drawings.

Figure 3:
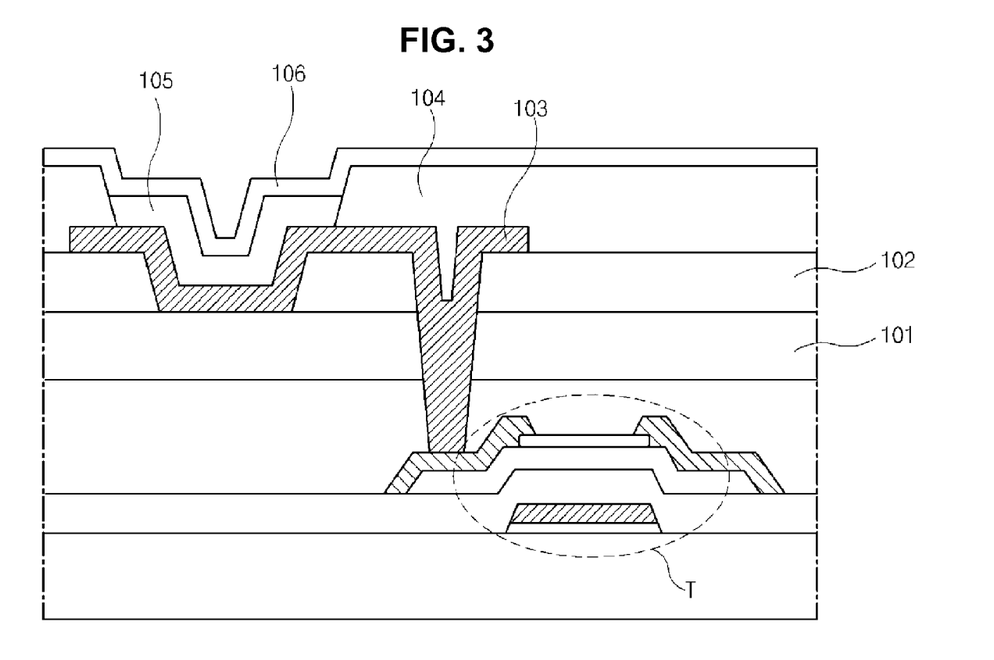
FIG. 3 is a schematic cross-section view of an OLED device according to an embodiment of the present invention.

FIG. 3 is a schematic cross-section view of an OLED device according to an embodiment of the present invention. The OLED device according to the embodiment of present invention includes a thin film transistor (TFT) "T" and an organic emitting diode over the TFT "T". The organic light emitting diode includes a lower electrode 103, an upper electrode 106 and an organic emitting layer 105 between the lower and upper electrodes 103 and 106.

The TFT "T" includes a gate electrode, a semiconductor layer, a source electrode and a drain electrode. The TFT "T" is controlled to be turned on and off by a signal, which is applied through the gate electrode. In the on state of the TFT "T", a data signal is applied to the drain electrode through the source electrode.

The lower electrode 103 of the organic light emitting diode is electrically connected to the drain electrode of the TFT "T", and electric current flows between the lower and upper electrodes 103 and 106 according to the data signal.

The light intensity emitted from the organic emitting layer 105 is proportional to the electric current between the lower and upper electrodes 103 and 106. Moreover, additional layers for efficiently injecting or transporting holes or electrons to the organic emitting layer 105 can be disposed between the organic emitting layer 105 and each of the lower electrode 103 and the upper electrode 106.

The TFT "T" may have a top gate structure, a bottom gate structure or a coplanar structure. The semiconductor layer may be formed of amorphous silicon, a low-temperature poly-crystalline silicon, an oxide semiconductor material or an organic semiconductor material.

A planarization layer 101 is disposed between the TFT "T" and the organic light emitting diode. The planarization layer 101 may be defined as a layer being formed between the TFT "T" and the organic light emitting diode and having a flat top surface to cover a step difference. The planarization layer 101 covers the TFT "T".

A first bank layer 102 is formed between the planarization layer 101 and the lower electrode 103 and includes a first opening and a second opening. A portion of the planarization layer 101 is exposed through the first opening, and a contact hole for connecting the lower electrode 103 to the TFT "T" is formed in the second opening. For example, the first bank layer 102 can have a thickness of less than about 2 micrometers.

Figure 4:
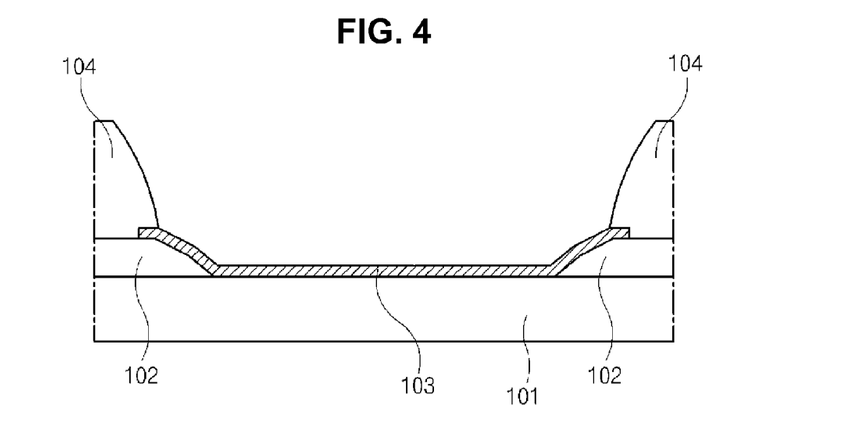
FIG. 4 is a schematic enlarged view of a portion of the OLED device as illustrated in FIG. 3, according to the embodiment of the present invention.
Figure 5:
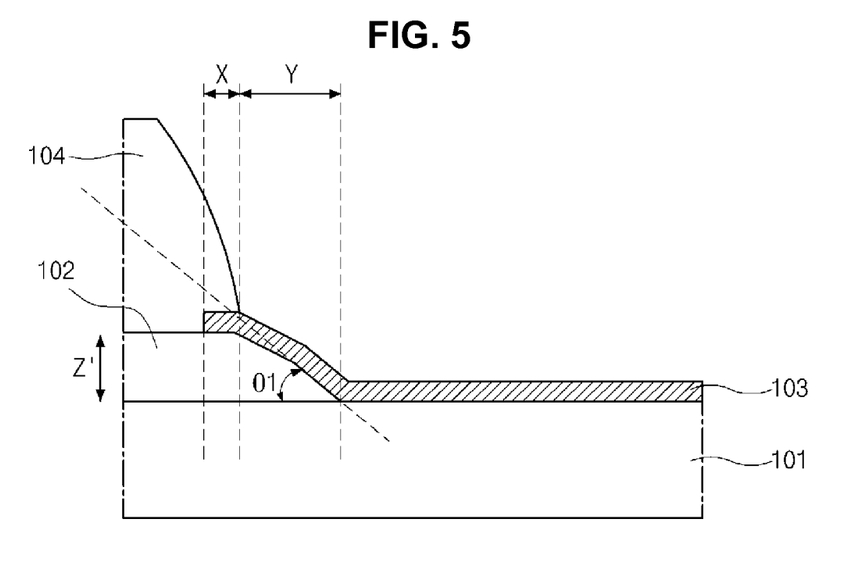
FIG. 5 is a schematic enlarged view of a portion of the OLED device as illustrated in FIG. 4, according to the embodiment of the present invention.
Figure 6:
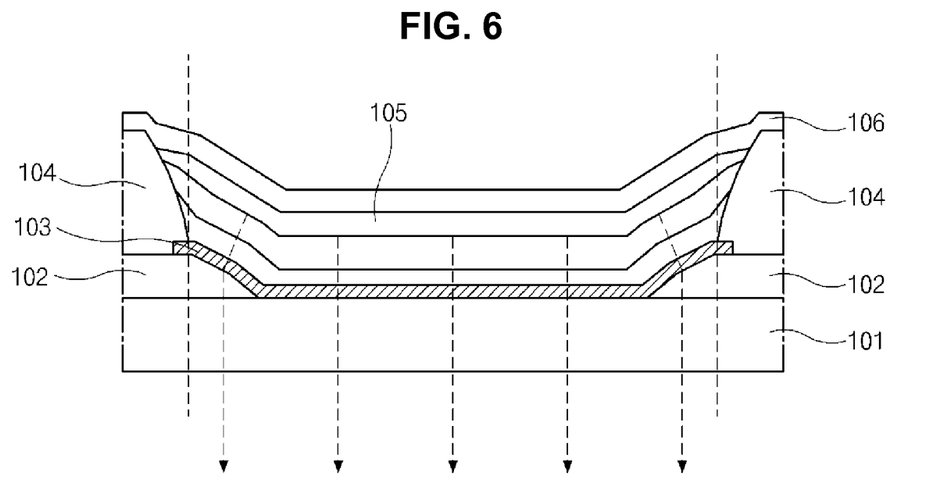
FIG. 6 is a schematic enlarged view of a portion of the OLED device as illustrated in FIG. 3, according to the embodiment of the present invention.

Next, FIG. 4 is a schematic enlarged view of a portion of the OLED device as illustrated in FIG. 3, according to the embodiment of the present invention; FIG. 5 is a schematic enlarged view of a portion of the OLED device as illustrated in FIG. 4, according to the embodiment of the present invention; and FIG. 6 is a schematic enlarged view of a portion of the OLED device as illustrated in FIG. 3 according to the embodiment of the present invention.

Referring to FIG. 4, the first bank layer 102 and the lower electrode 103 are formed on the planarization layer 101. The first bank layer 102 includes the first opening region to expose a portion of the planarization layer 101. The lower electrode 103 is formed to cover the portion of the planarization layer 101 exposed through the first opening. In addition, the first bank layer 102 has a flat part and an inclined part. The first opening may be surrounded by the inclined part of the first bank layer 102. Moreover, the lower electrode 103 can be formed to cover the inclined part and a portion of the flat part. Further, a center of the lower electrode 103 can be formed on an upper surface of the planarization layer 101, and peripheries of the lower electrode 103 can be formed on the inclined part. The lower electrode 103 can be disposed directly on the upper surface of the planarization layer 101. Alternatively, an additional layer such as a passivation layer can be formed between the lower electrode 103 and the planarization layer 101.

Referring to FIG. 5, the lower electrode 103 is disposed on the inclined part of the first bank layer 102 such that the periphery of the lower electrode 103 has an inclined angle θ1 with respect to the upper surface of the planarization layer 101. Namely, an end portion of the first bank layer 102 in the inclined part has the inclined angle θ1 with respect to the upper surface of the planarization layer 101.

By controlling the inclined angle θ1 of the first bank layer 102 according to a degree of the pile-up of an organic emitting material formed on the lower electrode 103, the problem of the thickness difference in the organic emitting layer 105 (refer to FIG. 3) due to the Coffee-Ring effect can be suppressed. As a result, a center and peripheries of the organic emitting layer 105 can have a uniform thickness.

For example, the inclined angle θ1 of the first bank layer 102 with respect to the planarization layer 101 may be within about 10 to about 70 degrees. When the inclined angle θ1 of the first bank layer 102 is below 10 degrees, the organic emitting material in one pixel region may overflow into an adjacent pixel region. When the inclined angle θ1 is above 70 degrees, a thickness of the organic emitting layer 105 in the periphery becomes thicker such that much organic emitting material may be needed to provide a desired thickness of the organic emitting layer.

A second bank layer 104 is disposed on the first bank layer 102. The second bank layer 104 includes a third opening exposing the first opening of the first bank layer 102. Ends of the lower electrode 103 are covered with the second bank layer 104. Namely, a lower surface of the lower electrode 103 contacts the first bank layer 102, and an upper surface of the lower electrode 103 contacts the second bank layer 104.

Since the second bank layer 104 covers the ends of the lower electrode 103, an electrical affect between adjacent pixels is prevented. The organic emitting layer 105 is formed on the lower electrode 103 exposed through the third opening to form an emitting area. The second bank layer 104 can be formed of a hydrophobic material. Movement of the organic emitting material toward peripheries of the lower electrode 103 is efficiently controlled by the hydrophobic second bank layer 104. For example, an acryl-based organic material or an imide-based organic material having a hydrophobic property may be used for the second bank layer 104.

Referring to FIG. 6, to concentrate the light emitted from the organic emitting layer 105, a refractive index of the first bank layer 102 is larger than that of the lower electrode 103. Namely, in a bottom emission type OLED device, due to the refractive index difference in an interface between the first bank layer 102 and the lower electrode 103, the light emitted from a peripheral portion of the organic emitting layer 105 on the first bank layer 102 is concentrated. The organic emitting layer 105 is disposed on the lower electrode 103 in the second opening of the second bank layer 104. The organic emitting layer 105 can be formed by a wet process and disposed inside the second opening of the second bank layer 104. Alternatively, the organic emitting layer 105 can be formed to extend onto an upper surface of the second bank layer 104. The upper electrode 106 is disposed on the organic emitting layer 105. The upper electrode 106 may be formed throughout emitting areas of a plurality of pixels. Alternatively, a plurality of upper electrodes 106 may be independently formed in each emitting area.

Figure 7:
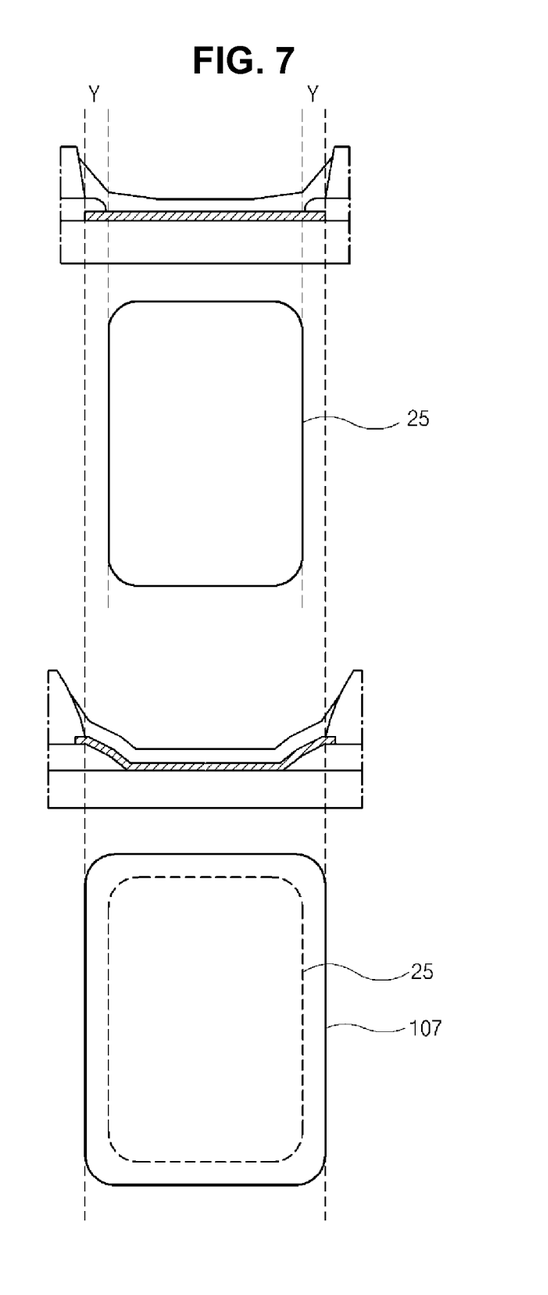
FIG. 7 is a schematic view illustrating an emitting area in the OLED device according to the embodiment of the present invention.

Referring to FIG. 7, a schematic view of an emitting area in the OLED device according to the embodiment of the present invention is illustrated. An emitting area of the OLED device according to the embodiment of the present invention can be larger than an emitting area of the related art OLED device. The emitting area of the embodiment of the present invention can be defined by an area of the organic emitting layer 105 contacting the lower electrode 103 (refer to FIG. 6).

In the OLED device according to related art, the lower electrode 24 (of FIG. 2A) is formed under the first bank layer 22 (refer to FIG. 2A). As a result, ends of the lower electrode 24 are covered with the first bank layer 22.

On the contrary, in the embodiment of the present invention, an area of the lower electrode 103 exposed through an opening of the first bank layer 102 is defined as a first emitting area 25, the lower electrode 103 being formed on the first bank layer 102. The lower electrode 103 on the inclined part of the first bank layer 102 and the planarization layer 101 except a portion of the lower electrode 103 covered with the second bank layer 104 is defined as a second emitting area 107. As a result, in comparison to the related art OLED device in which the lower electrode 24 (refer to FIG. 2A) is formed under the first bank layer 22 (refer to FIG. 2A) and ends of the lower electrode 24 are covered with the first bank layer 22, the emitting area in the OLED device according to the embodiment of the present invention is increased in size.

In addition, the size of the emitting area in the OLED device of the embodiment of the present invention varies according to a thickness and an inclined angle of the first bank layer 102. As shown in Table 1 below, the emitting area having a largest size corresponds to the first bank layer 102 having the thickness of 1.5 micrometers and the inclined angle of 10 degrees.

TABLE 1

| Thickness (Z', μm) | Inclined angle (θ1) | Increase amount (Y) | Increase ratio (%) |
| --- | --- | --- | --- |
| 0.5 | 20 | 1.34 | 107 |
| 0.5 | 10 | 2.81 | 114 |
| 1 | 20 | 2.68 | 113 |
| 1 | 10 | 5.61 | 128 |
| 1.5 | 20 | 4.01 | 120 |
| 1.5 | 10 | 8.42 | 143 |
| 2 | 20 | 5.35 | 127 |
| 2.5 | 20 | 6.69 | 134 |

Figure 8:
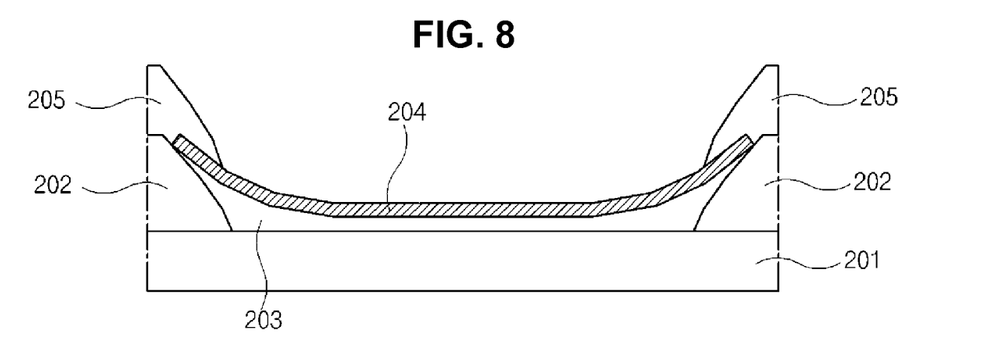
FIG. 8 is a schematic cross-section view of an OLED device according to another embodiment of the present invention.

Referring to FIG. 8, a schematic cross-section view of an OLED device according to another embodiment of the present invention is illustrated. The explanation for similar elements and principles in the another embodiment, as compared to the previous embodiment, in the present invention is omitted. A first bank layer 202 is disposed on the planarization layer 201. The first bank layer 202 has a flat part and an inclined part. The first bank layer 202 includes a first opening surrounded by the inclined part to expose a portion of the planarization layer 201. For example, the first bank layer 202 can have a thickness less than about 2 micrometers, and the inclined part may have an angle of about 10 to about 70 degrees with respect to the planarization layer 201.

A compensation layer 203 is formed in the first opening and on the planarization layer 201. Peripheries or ends of the compensation layer 203 are disposed on the inclined part of the first bank layer 202. A thickness of the compensation layer 203 in a center of the first opening is smaller than that of the compensation layer 203 in peripheries of the first opening. The compensation layer 203 can be formed, for example, by a wet process such as an inkjet method, a spin coating method, a nozzle printing method or a slit coating method. When the compensation layer 203 is formed by the wet process, the pile-up phenomenon by the surface tension is also generated in the compensation layer 203 such that a thickness difference is generated in the compensation layer 203.

A lower electrode 204 is disposed on the compensation layer 203. The lower electrode 204 can be formed of a transparent conductive material such as indium-tin-oxide (ITO) or indium-zinc-oxide (IZO). The lower electrode 204 is formed after the compensation layer 203 is dried. The compensation layer 203 is substantially flat in the center of the first opening and is inclined in the peripheries of the first opening. In addition, the lower electrode 204 has substantially the same surface shape as an upper surface of the compensation layer 203.

In addition, to concentrate the light emitted from the organic emitting layer, a refractive index of the compensation layer 203 is larger than a refractive index of the lower electrode 204. For example, the compensation layer 203 may be formed of polyimide-based polymer, polyacryl-based polymer or novolac-based polymer. Namely, a bottom emission type OLED device includes a refractive index difference in an interface between the compensation layer 203 and the lower electrode 204. As a result of the refractive index difference, the light emitted from the peripheral portion of the organic emitting layer in the bottom emission type OLED device is concentrated.

A second bank layer 205 including a second opening, which corresponds to the first opening, is formed on the first bank layer 202. The second bank layer 205 covers peripheries of the lower electrode 204. A size of the second opening may be substantially equal to that of the first opening. In other words, a width the second bank layer 205 may be substantially equal to that of the first bank layer 202.

Since the compensation layer 203 is formed on the planarization layer 201 and the first bank layer 202, a lower surface of the end of the lower electrode 204 contacts the compensation layer 203, and an upper surface of the end of the lower electrode 204 contacts the second bank layer 205.

An organic emitting layer can be disposed on the lower electrode 204. When the organic emitting layer is formed by a wet process, the solvent in the solution at the peripheries of the organic emitting layer is evaporated prior to the solvent in the solution at the center of the organic emitting layer. As a result, the movement of the organic emitting material toward the peripheries of the organic emitting layer is suppressed due to an upwardly-inclined structure from the center of the first opening to the peripheries of the first opening. Accordingly, similar to the OLED device according to the previous embodiment of the present invention as illustrated in FIGS. 3 to 7, the organic emitting layer according to the another embodiment of the present invention has a substantially uniform thickness in the center and the peripheries of the first opening, and an emitting area having an increased size.

Figure 9A:
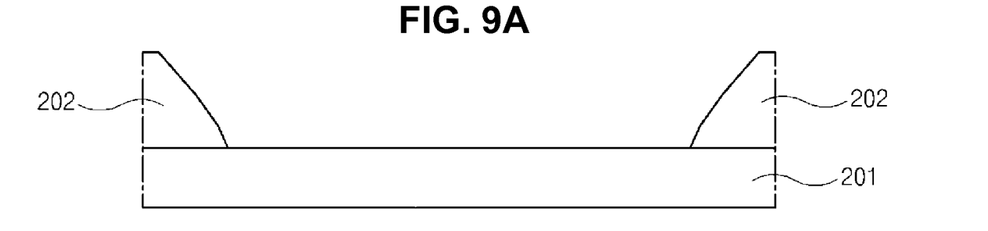
FIGS. 9A to 9E are schematic cross-sectional views showing a manufacturing process of the OLED device as illustrated in FIG. 8 according to the another embodiment of the present invention.

Next, FIGS. 9A to 9E are schematic cross-sectional views illustrating a manufacturing process of the OLED according to the another embodiment of the present invention. Referring to FIG. 9A, the first bank layer 202 including the first opening is formed on the planarization layer 201.

Figure 9B:
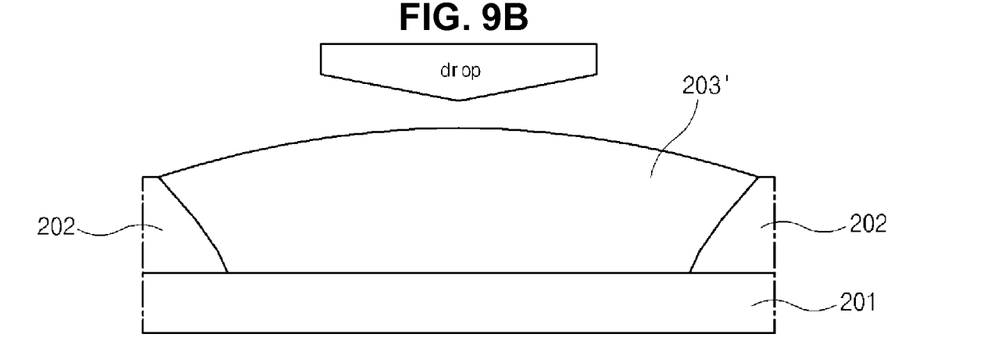

Referring to FIG. 9B, a material for the compensation layer 203 is dropped into the first opening to form a material layer 203'. The material layer 203' has a convex shape with respect to the planarization layer 201.

Figure 9C:
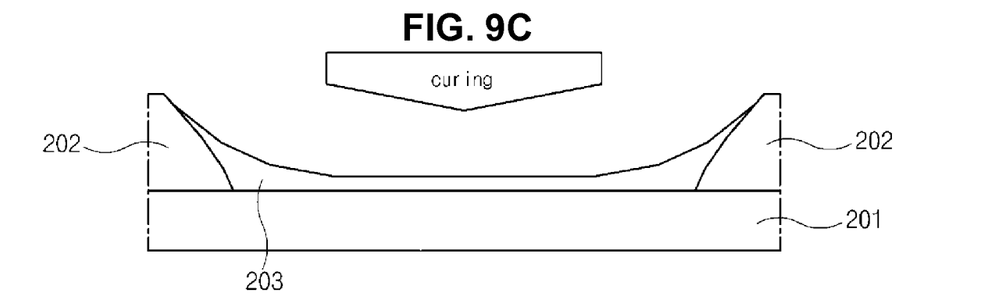

Referring to FIG. 9C, the material layer 203' (refer to FIG. 9B) is cured to form the compensation layer 203. By the pile-up phenomenon in the curing process, a thickness of the compensation layer 203 in peripheries of the first opening is larger than that of the compensation layer 203 in a center of the first opening.

Figure 9D:
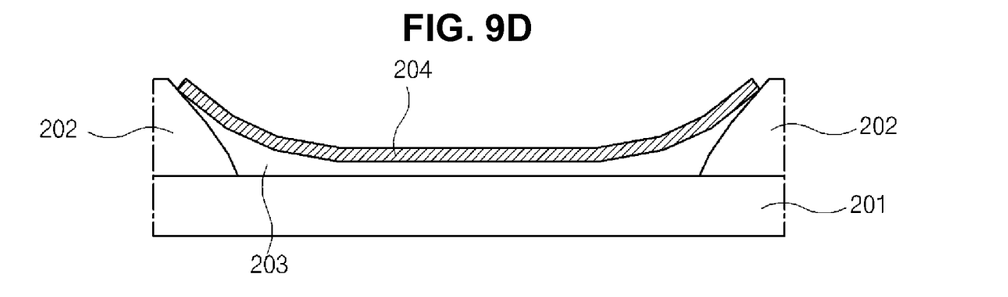

Referring to FIG. 9D, a lower electrode 204 disposed on the compensation layer 203 is shown.

Figure 9E:
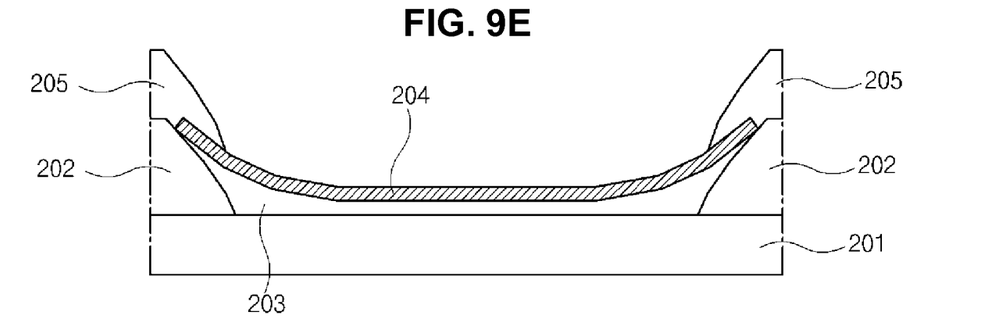

Referring to FIG. 9E, the second bank layer 205 is formed on the first bank layer 202. The second bank layer 205 covers ends of the lower electrode 204. The second bank layer 205 overlaps the end of both of the lower electrode 204 and the compensation layer 203. Alternatively, an organic emitting layer can be formed on the lower electrode, an upper electrode can be formed on the organic emitting layer, and an encapsulation film or substrate can be formed on the upper electrode such that the OLED device is provided.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display (OLED) device comprising:
   a substrate;
   a thin film transistor formed on the substrate;
   a planarization layer formed on the thin film transistor;
   a first bank layer formed on the planarization layer and including a first opening;
   a lower electrode formed in the first opening and connected to the thin film transistor, an end segment of the lower electrode being disposed on the first bank layer;
   a second bank layer formed on the first bank layer and covering the end segment of the lower electrode, the second bank layer including a second opening corresponding to the first opening;
   an organic emitting layer formed on the lower electrode and including a horizontal middle portion in the second opening, and including angled peripheral portions on each side of the horizontal middle portion; and
   an upper electrode formed on the organic emitting layer,
   wherein a top surface of the horizontal middle portion of the organic emitting layer is horizontal and flat, and parallel to a top surface of the substrate, and a top surface of each of the angled peripheral portions of the organic emitting layer is in a different plane than a top surface of the horizontal middle portion and is inclined with respect to the top surface the substrate, and
   wherein a lower surface of the lower electrode in the first opening contacts the planarization layer, and a lower surface of the end segment of the lower electrode contacts the first bank layer.

2. The OLED device according to claim 1, wherein the first bank layer has a horizontal part and an inclined part.

3. The OLED device according to claim 2, wherein the second opening is larger than the first opening.

4. The OLED device according to claim 3, wherein the first opening exposes a portion of the planarization layer.

5. The OLED device according to claim 1, wherein the first bank layer has a horizontal part and an inclined part, and
wherein peripheral portions of the lower electrode are formed on the inclined part of the first bank layer.

6. The OLED device according to claim 5, wherein the lower electrode is formed to cover the inclined part and a portion of the horizontal part of the first bank layer.

7. The OLED device according to claim 6, wherein the first bank layer has a thickness of between about 0.5 to 2.5 micrometers.

8. The OLED device according to claim 6, wherein the first bank layer has an inclined part having an angle of incline of between about 10 to 70 degrees.

9. The OLED device according to claim 8, wherein a center segment of the lower electrode is horizontal, and an intermediate segment of the lower electrode between the center segment and the end segment of the lower electrode is angled at a first slope, and
wherein the intermediate segment and the end segment of the lower electrode is on the first bank layer.

10. A method of manufacturing an organic light emitting display (OLED) device, the method comprising:
forming a substrate;
forming a thin film transistor on the substrate;
forming a planarization layer on the thin film transistor;
forming a first bank layer on the planarization layer and including a first opening;
forming a lower electrode in the first opening and connected to the thin film transistor, an end segment of the lower electrode being disposed on the first bank layer;
forming a second bank layer on the first bank layer and covering the end segment of the lower electrode, the second bank layer including a second opening corresponding to the first opening;
forming an organic emitting layer on the lower electrode and in the second opening, the organic emitting layer including a horizontal middle portion in the second opening, and including angled peripheral portions on each side of the horizontal middle portion; and
forming an upper electrode on the organic emitting layer,
wherein a top surface of the horizontal middle portion of the organic emitting layer is horizontal and flat, and parallel to a top surface of the substrate, and a top surface of each of the angled peripheral portions of the organic emitting layer is in a different plane than a top surface of the horizontal middle portion and is inclined with respect to the top surface the substrate, and
wherein a lower surface of the lower electrode in the first opening contacts the planarization layer, and a lower surface of the end segment of the lower electrode contacts the first bank layer.

11. The method according to claim 10, wherein the first bank layer has a horizontal part and an inclined part.

12. The method according to claim 11, wherein the second opening is larger than the first opening.

13. The method according to claim 12, wherein the first opening exposes a portion of the planarization layer.

14. The method according to claim 10, wherein the first bank layer has a horizontal part and an inclined part, and
wherein peripheral portions of the lower electrode are formed on the inclined part of the first bank layer.

15. The method according to claim 14, wherein the lower electrode is formed to cover the inclined part and a portion of the horizontal part of the first bank layer.

16. The method according to claim 15, wherein the first bank layer has a thickness of between about 0.5 to 2.5 micrometers.

17. The method according to claim 15, wherein the first bank layer has an inclined part having an angle of incline of between about 10 to 70 degrees.

18. The method according to claim 17, wherein a center segment of the lower electrode is horizontal, and an intermediate segment of the lower electrode between the center segment and the end segment of the lower electrode is angled at a first slope, and
wherein the intermediate segment and the end segment of the lower electrode is on the first bank layer.

19. An organic light emitting display (OLED) device comprising:
a substrate;
a thin film transistor formed on the substrate;
a planarization layer formed on the thin film transistor;
a first bank layer formed on the planarization layer and including a first opening;
a compensation layer formed on the planarization layer and the first bank layer;
a lower electrode formed in the first opening and connected to the thin film transistor, an end segment of the lower electrode being disposed on the first bank layer;
a second bank layer formed on the first bank layer and covering the end segment of the lower electrode, the second bank layer including a second opening corresponding to the first opening;
an organic emitting layer formed on the lower electrode and including a horizontal middle portion in the second opening, and including angled peripheral portions on each side of the horizontal middle portion; and
an upper electrode formed on the organic emitting layer,
wherein a top surface of the horizontal middle portion of the organic emitting layer is horizontal and flat, and parallel to a top surface of the substrate, and a top surface of each of the angled peripheral portions of the organic emitting layer is in a different plane than a top surface of the horizontal middle portion and is inclined with respect to the top surface the substrate, and
wherein a lower surface of the compensation layer in the first opening contacts the planarization layer, and a lower surface of the end segment of the compensation layer contacts the first bank layer.

20. A method of manufacturing an organic light emitting display (OLED) device, the method comprising:
forming a substrate;
forming a thin film transistor on the substrate;
forming a planarization layer on the thin film transistor;
forming a first bank layer on the planarization layer and including a first opening;
forming a compensation layer on the planarization layer and the first bank layer;
forming a lower electrode in the first opening and connected to the thin film transistor, an end segment of the lower electrode being disposed on the first bank layer;
forming a second bank layer on the first bank layer and covering the end segment of the lower electrode, the second bank layer including a second opening corresponding to the first opening;

forming an organic emitting layer on the lower electrode and in the second opening, the organic emitting layer including a horizontal middle portion in the second opening, and including angled peripheral portions on each side of the horizontal middle portion; and forming an upper electrode on the organic emitting layer, wherein a top surface of the horizontal middle portion of the organic emitting layer is horizontal and flat, and parallel to a top surface of the substrate, and a top surface of each of the angled peripheral portions of the organic emitting layer is in a different plane than a top surface of the horizontal middle portion and is inclined with respect to the top surface the substrate, and wherein a lower surface of the compensation layer in the first opening contacts the planarization layer, and a lower surface of the end segment of the compensation layer contacts the first bank layer.

\* \* \* \* \*